United States Patent
Hidaka

(10) Patent No.: US 6,888,772 B2
(45) Date of Patent: May 3, 2005

(54) NON-VOLATILE MEMORY DEVICE ACHIEVING FAST DATA READING BY REDUCING DATA LINE CHARGING PERIOD

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 141 days.

(21) Appl. No.: 10/458,369

(22) Filed: Jun. 11, 2003

(65) Prior Publication Data

US 2004/0095828 A1 May 20, 2004

(30) Foreign Application Priority Data

Nov. 18, 2002 (JP) ........................................ 2002-333581

(51) Int. Cl.[7] .............................................. G11C 7/02
(52) U.S. Cl. .................... 365/209; 365/189.07
(58) Field of Search ............................ 365/209, 189.07

(56) References Cited

U.S. PATENT DOCUMENTS 6,724,662 B2 * 4/2004 Manea ..................... 365/185.3
6,803,821 B1 * 10/2004 DeFalco et al. ............ 330/288

OTHER PUBLICATIONS

Roy Scheuerlein et al., "A 10ns Read and Write Non–Volatile Memory Array Using a Magnetic Tunnel Junction and FET Switch in each Cell", IEEE ISSCC Digest of Technical Papers, TA7.2, 2000.

M. Durlam et al., "Nonvolatile RAM based on Magnetic Tunnel Junction Elements", IEEE ISSCC Digest of Technical Papers, TA7.3, 2000.

Peter K. Naji et al., "A 256kb 3.0 1T1MTJ Nonvolatile Magnetoresistive RAM", IEEE ISSCC Digest of Technical Papers, TA7.6, 2001.

"Forefront of Non–Volatile Memory/The Future in Intel's Mind: From Flash Memory to OUM", Nikkei Microdevices, Mar., 2002, pp. 65–78 (Partial English Translation).

* cited by examiner

*Primary Examiner*—M. Tran
(74) *Attorney, Agent, or Firm*—McDermott Will & Emery LLP

(57) ABSTRACT

Capacitors are provided for changing the voltage level of data lines, respectively, in a data reading operation. A signal line electrically coupled to capacitors is provided. Capacitors charge data lines in accordance with the voltage level of signal line by capacitive coupling. Thus, data lines can be charged quickly to achieve a fast data reading operation.

7 Claims, 16 Drawing Sheets

RESISTANCE SMALL

RESISTANCE LARGE

NON-VOLATILE MEMORY DEVICE ACHIEVING FAST DATA READING BY REDUCING DATA LINE CHARGING PERIOD

BACKGROUND OF THE INVENTION

1. Field of the Invention

The present invention relates to a non-volatile memory device, and more specifically, to a non-volatile memory device achieving a fast data reading.

2. Description of the Background Art

Recently, non-volatile memory devices capable of storing a data in a non-volatile manner are widely used. A flash memory capable of higher integration can be named, for instance. Further, as a non-volatile memory device of a new generation, attention is especially given to a device such as an MRAM (Magnetic Random Access Memory) device that uses magnetic thin material to achieve non-volatile data storage, or a variable resistance memory device that uses thin film material called chalcogenide to store a data through phase transition. The MRAM device is disclosed in "A 10 ns Read and Write Non-Volatile Memory Array Using a Magnetic Tunnel Junction and FET Switch in each Cell", 2000 IEEE ISSCC Digest of Technical Papers, TA7.2. The variable resistance memory device is disclosed in "Forefront of Non-Volatile Memory/The Future in Intel's Mind: From Flash Memory to OUM," Nikkei Microdevices, March, 2002, pp. 65–78.

In general configuration, when reading a stored data in a memory cell used as a memory element of such a non-volatile memory device, the data reading is performed as follows: a voltage of prescribed level is applied to the cell and a current passing through it (hereinafter referred to as a pass current) is detected.

For example, in order to read a stored data in an MTJ memory cell (MTJ: Magnetic Tunnel Junction), the data reading is achieved based on a pass current in MTJ memory cell that changes in accordance with an electric resistance corresponding to the level of the stored data level (i.e., the stored data).

As for a memory array of a large capacity, a general configuration includes a plurality of bit lines arranged corresponding to rows or columns, and a data line commonly provided to the plurality of bit lines and connected to a circuit detecting a stored data. In this configuration, when reading a data, a pass current is provided to a memory cell by charging the data line and a selected bit line to a prescribed voltage level, as described above. Thus, a charging period for charging the lines to the prescribed voltage level is required. The charging period increases as signal lines, such as a data line and a bit line, made longer in order to meet the demand for a memory array of a large capacity. A fast data reading is thus hindered undesirably.

SUMMARY OF THE INVENTION

The object of the present invention is to provide a non-volatile memory device capable of reducing a charging period of signal lines such as data line or a bit line to achieve fast data reading operation.

A non-volatile memory device according to the present invention includes a plurality of memory cells, a plurality of bit lines, a data line, a reference current supplying unit, a differential amplifier, and a level adjusting circuit. The plurality of memory cells each passes a pass current corresponding to a stored data in a data reading operation. At least one of the plurality of bit lines is connected to a first voltage via a selected memory cell corresponding to a selected address among the plurality of memory cells in the data reading operation. The data line is commonly provided for the plurality of bit lines and electrically coupled to at least one of the plurality of bit lines in the data reading operation. The reference current supplying unit generates a reference current to be used in a comparison with the selected memory cell. The differential amplifier is connected to a second voltage in data reading operation to provide a pass current to the data line, and to read the stored data in the selected memory cell corresponding to a current difference between the pass current and the reference current generated by the reference current supplying unit. The level adjusting circuit is provided corresponding to the data line to change the voltage level of the data line and the like by the capacitive coupling in the data reading operation.

As described above, the present invention can change the voltage level of a data line in a data reading operation by a level adjusting circuit. Accordingly, the charging period of a data line can be reduced to achieve a fast data reading operation.

Further, the non-volatile memory device includes a plurality of memory cells, a plurality of bit lines, a data line, a reference current supplying unit, a differential amplifier, a capacitive element, and a signal line. The plurality of memory cells each passes a pass current corresponding to a stored data in a data reading operation. At least one of the plurality of bit lines is connected to a first voltage via a selected memory cell corresponding to a selected address among the plurality of memory cells in the data reading operation. The data line is commonly provided for the plurality of bit lines and electrically coupled to at least one of the plurality of bit lines in the data reading operation. The reference current supplying unit generates a reference current to be used in a comparison with the selected memory cell. The differential amplifier is connected to a second voltage in data reading operation to provide a pass current to the data line, and to read the stored data in the selected memory cell corresponding to a current difference between the pass current and the reference current generated by the reference current supplying unit. The capacitive element is provided corresponding to the data line, and formed with a metal insulator semiconductor field effect transistor having its gate electrically coupled to the data line. The signal line is electrically coupled to source and drain of the capacitive element. The capacitive element raises the level of the data line for a prescribed period.

Still further, a capacitive element is provided, which has its gate electrically coupled to the data line and has its source and drain electrically coupled to the signal line. Accordingly, the charging period of a data line can be reduced to achieve a fast data reading operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
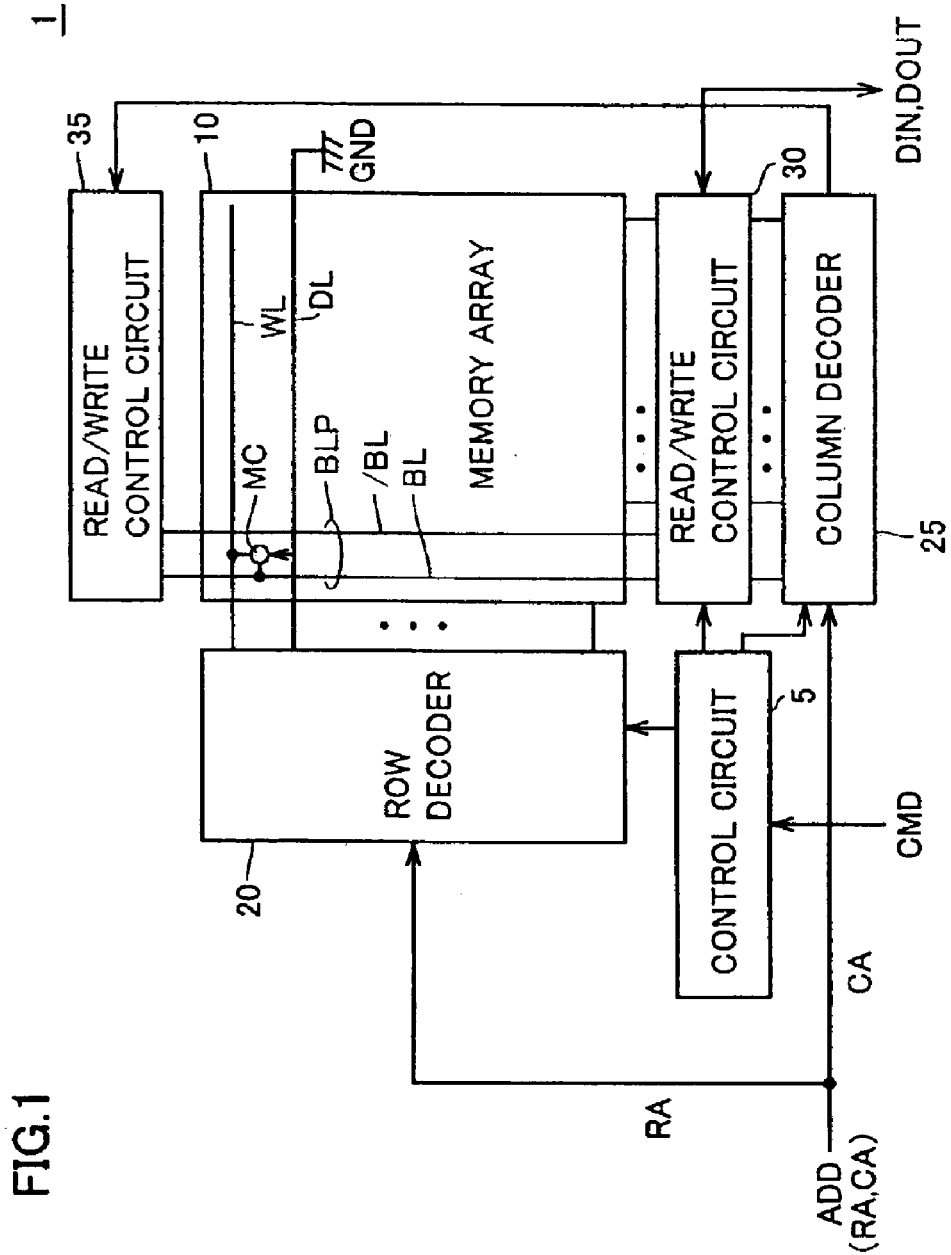
FIG. 1 is a schematic block diagram showing an overall configuration of MRAM device as a representative example of a non-volatile memory device according to a first embodiment of the present invention.

In the following, embodiments of the present embodiments will be described in detail referring to the figures. An identical reference character in the figures indicates identical or similar parts.

First Embodiment

Referring to FIG. 1, an MRAM device 1, shown as a representative example of a non-volatile memory device, according to a first embodiment of the present invention performs random access in response to a control signal CMD and an address signal ADD from the outside to input an input data DIN and to output an output data DOUT.

MRAM device 1 includes a control circuit 5 controlling an overall operation of MRAM device 1 in response to control signal CMD, and a memory array 10 including MTJ memory cells arranged in rows and columns.

As can be seen from the description above, the application of the present invention is not limited to an MRAM device with MTJ memory cells, but also commonly applicable to non-volatile memory devices with memory cells through which a pass current flows that corresponds to the level of a magnetically written stored data.

In memory array 10, a word line WL and a digit line DL is arranged corresponding to a column of the MTJ memory cell. A bit line pair BLP formed by complementary bit lines BL and /BL is arranged corresponding to a memory cell column pair, which is formed by two adjacent memory cell columns. In FIG. 1, the arrangement of one MTJ memory cell MC as a representative, and corresponding word line WL, digit line DL, and bit line pair BLP provided corresponding to the pair of memory cell columns are shown.

MRAM device 1 further includes a row decoder 20 decoding a row address RA designated by an address signal to perform a row selection in memory array 10, a column decoder 25 decoding a column address CA designated by an address signal ADD to perform column selection in memory array 10, and read/write control circuits 30 and 35.

Read/write control circuits 30 and 35 generally refer to a group of circuits performing a data write operation to memory array 10, and a group of circuits performing a data reading operation to memory array 10 (hereinafter also referred to as "a data reading circuit system").

Digit line DL is coupled to ground voltage GND in an area opposing to row decoder 20, with memory array 10 therebetween.

Figure 2:
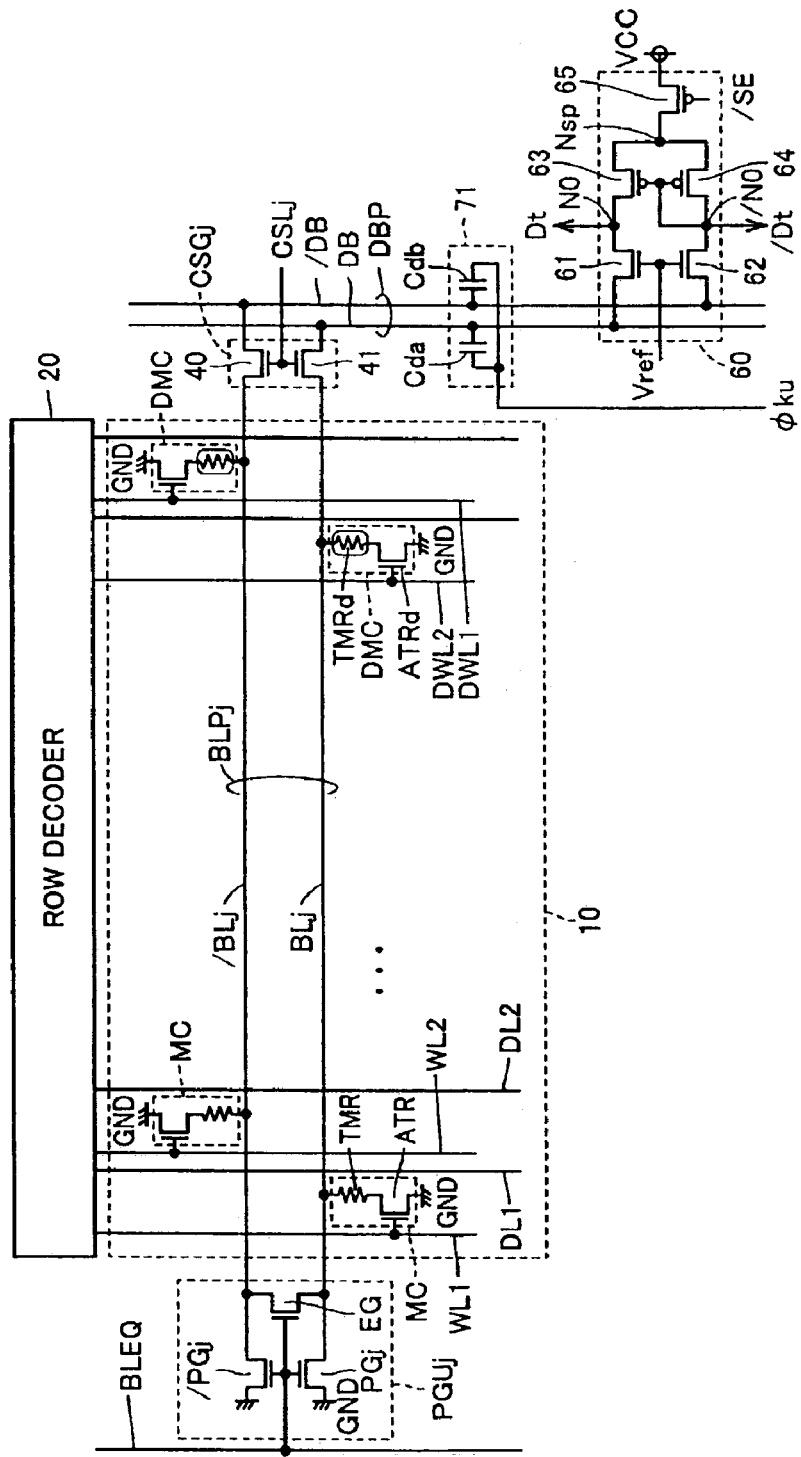
FIG. 2 shows a configuration of a data reading circuit system according to the first embodiment of the present invention.

Referring to FIG. 2, in the data reading circuit system according to the first embodiment of the present invention, bit line pair BLP configured with complementary bit lines BL and /BL is arranged corresponding to each memory cell column.

Memory cell MC is arranged alternatively in opposing sides so as to be connected to bit line BL in an odd row, and to be connected to bit line /BL in an even row. Memory cell MC includes a tunneling-magneto-resistance element TMR in which electric resistance changes in accordance with the level of a magnetically written stored data, and an access element (access transistor) ATR. Access transistor ATR is serially connected to tunneling-magneto-resistance element TMR between bit line BL and ground voltage GND. Representatively, a field-effect transistor formed on a semiconductor substrate is employed as access transistor ATR.

Representatively shown in FIG. 2 are word lines WL1, WL2, digit lines DL1, DL2 corresponding to first and second memory cell rows, respectively, and bit lines BLj, /BLj corresponding to the jth (j: a natural number) memory cell column, corresponding memory cell MC, and a dummy memory cell DMC provided as a comparison target of memory cell MC.

Now, the configuration of MTG memory cell and the data storage principle is described.

Figure 3:
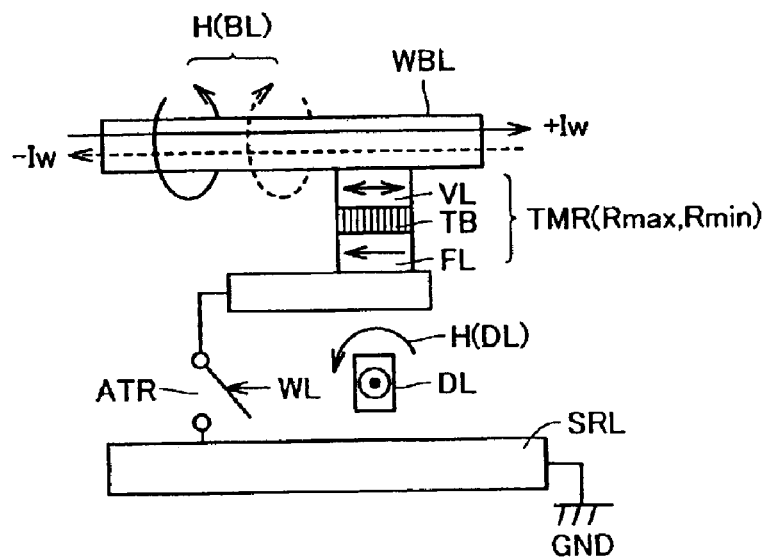
FIG. 3 is a conceptual illustration related to the description of a structure of a memory cell and data storage principle.

Referring to FIG. 3, tunneling magneto-resistance element TMR has a ferromagnetic material layer with a fixed constant magnetic orientation (hereinafter simply referred to as "a fixed magnetic layer" also) FL, and a ferromagnetic material layer which can be magnetized in the direction in accordance with an impressed magnetic field (hereinafter simply referred to as "free magnetic layer" also) VL. A tunneling barrier (tunneling film) TB formed with an insulating material is provided between fixed magnetic layer FL and free magnetic layer VL. Free magnetic layer VL is magnetized in the same or opposite direction to fixed magnetic layer FL depending on the level of a stored data being written. With such fixed magnetic layer FL, tunneling barrier TB and free magnetic layer VL, a magnetic tunnel junction is formed.

The electric resistance of tunneling magneto-resistance element TMR changes in accordance with the relative relationship of magnetic orientation of fixed magnetic layer FL and that of free magnetic layer VL. Specifically, the electric resistance of tunneling magneto-resistance element TMR will be the minimum value of Rmin when the magnetic orientations of fixed magnetic layer FL and free magnetic layer VL are the same (in parallel), and will be the maximum value of Rmax when they are opposite (in anti-parallel) to each other.

In data writing, word line RWL is deactivated and access transistor ATR turns off. In this state, a data write current for magnetizing free magnetization layer VL flows in the directions (±Iw) corresponding to the level of a write data in bit line BL and digit line DL, respectively.

With FIG. 4, the relationship between a data write current supply to an MTJ memory cell and a magnetic orientation of a tunneling magneto-resistance element will be described.

Figure 4:
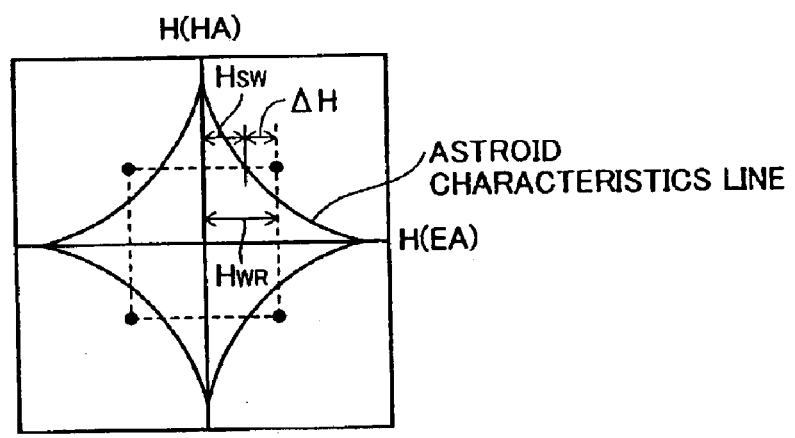
FIG. 4 is a conceptual illustration showing the relationship between a data write current supply to a memory cell and a magnetic orientation of a tunneling magneto-resistance element.

Referring to FIG. 4, horizontal axis H (EA) indicates the magnetic field applied in Easy Axis (EA) direction in free magnetic layer VL in tunneling magneto-resistance element TMR. Vertical axis (HA) indicates the magnetic field acting in the hard axis (HA) direction in free magnetic layer VL. Magnetic fields H (EA) and H (HA) correspond to magnetic fields generated by currents flow through bit line BL and digit lines DL, respectively.

In MTJ memory cell, the fixed magnetic orientation of fixed magnetic layer FL extends along the easy axis of free magnetic layer VL, and free magnetic layer VL is magnetized in the direction parallel to or anti-parallel (opposite) to fixed magnetic layer FL, depending on the level of the stored data. MTJ memory cell can store a data of 1 bit, corresponding to the two magnetic orientations of free magnetic layer VL.

The magnetic orientation of free magnetic layer VL can be rewritten only when sum of applied magnetic fields H(EA) and H(HA) reaches the region external to an astroid characteristic line shown in FIG. 4. Specifically, when applied data write magnetic field has an intensity that stays in the region inside the astroid characteristic line, the magnetic orientation of free magnetic layer VL will not change.

As indicated by the astroid characteristic line, by applying the magnetic field to free magnetic layer VL in the direction of hard axis, the magnetization threshold value required to change the magnetic orientation along the easy axis can be lowered. As shown in FIG. 3, the operating point in data writing is designed such that the stored data in the MTJ memory cell, i.e., the magnetic orientation of tunneling magneto-resistance element TMR, is rewritten when a prescribed data write current is passed through both of digit line DL and bit line BL.

In the operating point exemplary shown in FIG. 4, in the data-writing target, i.e., the MTJ memory cell, the data write magnetic field in the easy axis is designed such that the intensity thereof will be Hwr. Specifically, the value of a data write current to be passed through bit line BL or digit line DL is designed so that the data write magnetic field Hwwr can be obtained. Generally, data write magnetic field Hwr is expressed by the sum of switching magnetic field Hsw that is required for switching the magnetic orientation and the margin ΔH. Hence, Hwr=Hsw+ΔH.

The magnetic orientation that has been written in tunneling magneto-resistance element TMR, i.e., the stored data of MTJ memory cell, will be retained in a non-volatile manner until a new data writing is performed. Though the electric resistance in each memory cell is, in a strict sense, the sum of tunneling magneto-resistance element TMR, on-resistance of access transistor TR, and other parasitic resistance, the resistances other than that of tunneling magneto-resistance element TMR are stable irrespective of the stored data. Hence, in the following, the electric resistance of regular memory cells of two types corresponding to the stored data will be expressed as Rmax and Rmin, respectively, and the difference therebetween will be expressed as ΔR. Hence, ΔR=Rmax−Rmin.

Referring back to FIG. 2, memory cell MC and dummy memory cell DM are arranged in memory array 10, as described above. Specifically, dummy memory cell is arranged for two rows so as to share a memory cell column with regular memory cell MC.

Corresponding to a column of dummy memory cell, dummy word lines DWL1 and DWL2 are arranged, respectively. Dummy memory cells corresponding to dummy word line DWL1 each have a dummy magneto-resistance element TMRd and a dummy access element (access transistor) ATRd, which are connected between corresponding bit line /BLj and ground voltage GND. Dummy access element ATRd turns on in accordance with dummy word line DWL1 that is activated when bit line BL is selected.

Dummy memory cells corresponding to dummy word line DWL2 each have a dummy magneto-resistance element TMRd and a dummy access element (access transistor) ATRd, which are connected between corresponding bit line BLj and ground voltage GND. Dummy access element ATRd turns on in accordance with dummy word line DWL2 that is activated when bit line /BL is selected.

The electric resistance Rm of each dummy memory cell DMC is designed as Rm=Rmin+(ΔR/2). For instance, by structuring dummy magneto-resistance element TMRd with tunneling magneto-resistance element TMR that is similar to that in memory cell MC and storing a data corresponding to electric resistance Rmin, and set the on-resistance of dummy access element ATRd larger than that of access transistor ATR by ΔR/2, dummy memory cell DMC can be configured. It is also possible to configure dummy memory cell DMC by designing the on-resistance of dummy access element ATRd and that of access transistor ATR at the same value, while forming dummy magneto-resistance element TMRd by serially connecting tunneling magneto-resistance element TMR storing a data corresponding to electric resistance Rmin and a fixed resistor with an electric resistance of ΔR/2. Based on the design above, in data reading, a reference current flows through this dummy memory cell DMC, which is to be compared with a pass current flowing through a selected memory cell.

The data reading circuit system according to the first embodiment of the present invention further includes a column select gate CSG arranged corresponding to each memory column, complementary data lines DB and /DB arranged adjacent to memory array 10, and a differential amplifier 60 providing read data Dt, /Dt in accordance with the difference between pass currents of respective data lines. Data lines DB and /DB form a data line pair DBP.

Column select gate CSG includes transistors 40, 41 connected between the other ends of bit lines BL /BL and data lines DB, /DB, respectively, of which gates turn on in response to the activation of corresponding column select line CSL. For instance, a column select gate CSGj connects the other ends of corresponding bit lines BLj, /BLj to data lines DB, /DB, respectively, in response to the activation of a column select line CSLj.

Differential amplifier 60 is connected to data lines DB and /DB to amplify the difference between respective pass currents flowing therethrough, and convert it to the voltage difference between nodes N0 and /N0.

Differential amplifier 60 includes an N-channel MOS transistor 61 connected between node N0 and data line DB, an N-channel MOS transistor 62 connected between node /N0 and data line /DB, a P-channel MOS transistor 63 connected between nodes Nsp and N0, a P-channel MOS transistor 64 connected between nodes Nsp and /N0, and a P-channel MOS transistor 65 connected between power supply voltage VCC and node Nsp.

Each gate of transistors 63 and 64 is connected to node /N0. Transistors 63 and 64 forms a current mirror circuit to supply the same current to nodes N0 and /N0.

Each gate of transistors 61 and 62 is provided with a fixed reference voltage Vref generated by a Vref generating circuit 55. Transistors 61 and 62 maintain data lines DB and /DB to the reference voltage at most, and amplify the difference between respective pass currents flowing therethrough, and convert it to the voltage difference between nodes N0 and /N0.

A sense enable signal ISE is provided to the gate of transistor 65, which will be activated to "L" level by row decoder 20 in a data reading operation. Transistor 65 supplies an operating current to allow differential amplifier 60 to operate, in response to the activation (to "L" level) of sense enable signal /SE.

A level adjusting circuit 71 is provided to data lines DB and /DB for changing voltage level of data lines DB and /DB in data reading.

Level adjusting circuit 71 includes a signal line φku for designating the change of voltage level, a capacitor Cda provided corresponding to data line DB and arranged between data line DB and signal line φku, and a capacitor Cdb provided corresponding to data line /DB and arranged between data line /DB and signal line φku.

Additionally, a precharge unit PGUj provided corresponding to bit line pair BLPj to precharge bit lines BLj, /BLj is provided. Precharge unit PGUj includes precharge gates PGj, /PGj (hereinafter referred to as precharge gates PG, /PG generally) and an equalize gate EG. Each of precharge gates PG, /PG couples corresponding one ends of bit lines BL and /BL to ground voltage in response to bit line precharge signal BLEQ. Equalize gate EG electrically couples bit lines BL and /BL.

In the following, binary high voltage state (e.g., power supply voltage VCC) and low voltage state (e.g., ground voltage GND) of a signal, a signal line, a data and the like will also be referred to as "H" and "L" levels, respectively.

Next, a data reading operation from the MTJ memory cell according to the first embodiment of the present invention will be described.

Figure 5:
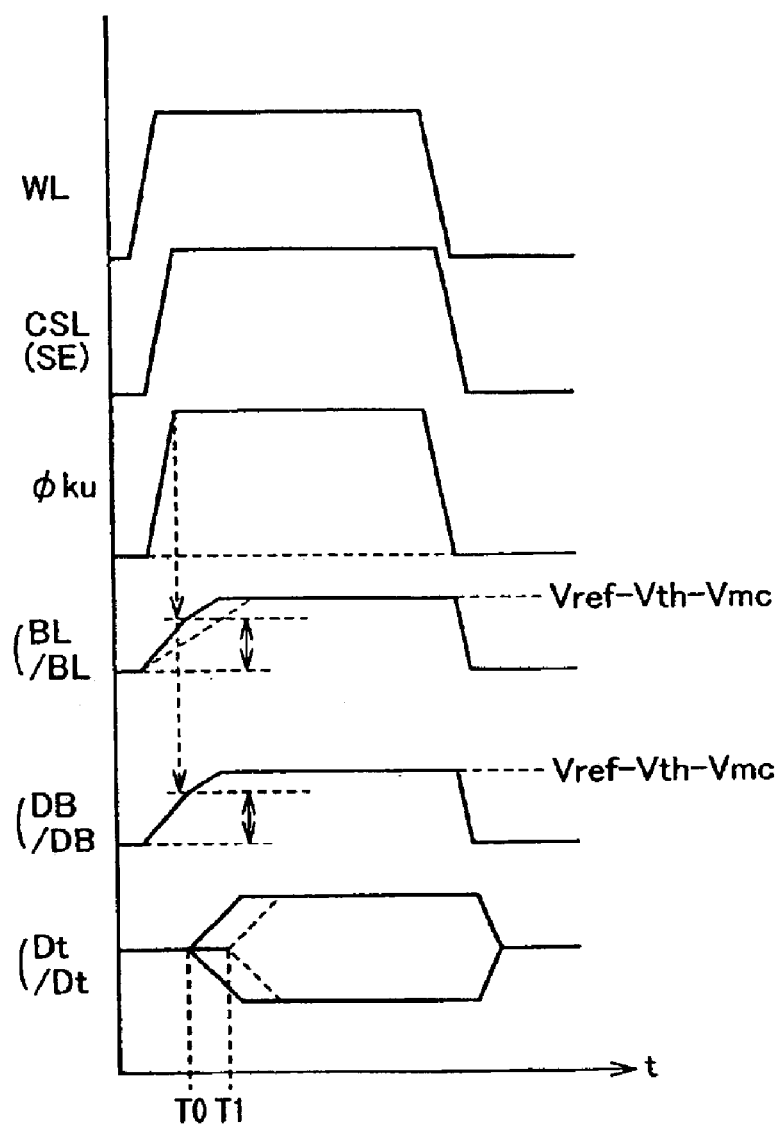
FIG. 5 is a timing chart indicating a data reading operation of MRAM device according to the first embodiment of the present invention.

With the timing chart of FIG. 5, a data reading operation of MRAM device according to the first embodiment of the present invention is described.

In this embodiment, an operation where the first row and the jth column are selected for the target of a reading operation is representatively described.

Referring to FIG. 5, since each word line WL is deactivated before a data reading operation, bit lines BL, /BL are disconnected from memory cell MC and dummy memory cell DMC. Further, since bit line precharge signal BLPR is activated, bit lines BL, /BL are each precharged to ground voltage GND.

Still further, since each column select line CSL is also deactivated, data lines DB and /DB are disconnected from each bit lines BL and /BL.

In data reading, bit line precharge signal BLPR is deactivated, and bit lines BL and /BL are each disconnected from ground voltage. Additionally, in response to an address selection, the word line of the select row, the column select line and one of dummy word lines DWL1 and DWL2 of the select column are selectively activated. An inversion signal /SE of control signal SE ("H" level) is set to "L" level, and differential amplifier 60 is activated.

In response thereto, data line DB and bit line BL of the select column is electrically coupled between power supply voltage VCC and ground voltage GND, via one of the selected memory cell MC and dummy memory cell DMC. Similarly, data line DB and bit line /BL of select column is electrically coupled between power supply voltage VCC and ground voltage GND via the other one of selected memory cell MC and dummy memory cell DMC. Thus, a pass current corresponding to a stored data is supplied to the selected memory cell MC, and a reference current is supplied to dummy memory cell DMC. When the reference current passes, a reference current supplying unit is formed by differential amplifier 60, data line DB (/DB) column select gate CSG, bit line BL (/BL), dummy memory cell DMC, and ground voltage.

Here, signal line φku is activated. Accordingly, the voltage level of bit line and data line is boosted instantaneously by the capacitive coupling of capacitors Cda and Cdb.

Thus, at time point T0, a detectable pass current difference between data lines DB and /DB occurs quickly, which corresponds to a stored data.

In accordance with the pass current difference between data lines DB and /DB, the voltage difference corresponding to the stored data of the selected memory cell MC occurs between nodes N0 and /N0. As a result, differential amplifier 60 generates read data Dt, /Dt effected with the level of the stored data of selected memory cell MC.

Therefore, as shown in FIG. 5, by providing level adjusting circuit 71, the pass current difference corresponding to the stored data occurs at time point T0, which is earlier than time point T1 where a detectable pass current difference occurs without level adjusting circuit 71. Accordingly, a fast data reading operation can be achieved.

It should be noted that when data line DB and dummy memory cell DMC is connected, a similar data reading operation based on the pass current difference between the selected memory cell MC and dummy memory cell DMC can be achieved, without switching the connection between the input of differential amplifier 60 and data lines DB, /DB.

On the other hand, a voltage difference does not occur between bit lines BLj and /BLj as well as between data lines DB and /DB, and each voltage thereof will stay at "Vref-Vth-Vmc". Here, Vth corresponds to the threshold voltage of transistors 61, 62, and Vmc corresponds to the voltage drop occurring in memory cell MC and dummy memory cell DMC. Reference voltage Vref is designed such that the voltage "Vref-Vth-Vmc" will be about 400 mV, for example, taking account of the reliability and the like of a tunneling barrier in the tunneling magneto-resistance element, i.e., an insulating film. Thus, the memory cell breakdown by an excessive voltage application can be avoided, and hence the operation reliability can be increased.

As has been described above, in the configuration according to the first embodiment, the charging period for data line pair DBP is reduced by activating signal line φku in data reading to raise the voltage level of bit lines and data lines by the capacitive coupling of capacitors Cda and Cdb. In other words, the charging period for charging bit lines and data lines to a prescribed voltage level is reduced. Accordingly, a fast data reading operation can be achieved.

Further, the number of parts of the circuit can be reduced in the present configuration where a capacitor is provided corresponding to each data lines DB, /DB to boost the voltage level of bit lines and data lines, as compared to the configuration where a capacitor is provided corresponding to each bit lines BL, /BL. Thus, an efficient layout can be attained.

It is also possible to provide an additional capacitor for each bit line BL, other than data line DB. In this case, the charging period of data lines DB, /DB can further be reduced, achieving an ever faster data reading operation. Though the configuration where complementary bit lines BL, /BL are commonly selected to perform a data reading operation has been described in the present embodiment as an example, the present invention is not limited to this configuration. It is also possible to employ a configuration where at least one bit line is selected among a plurality of bit lines to be connected to a selected memory cell for performing a data reading operation according to the comparison with a reference current. In this instance, the reference current can be generated by a constant current circuit. It is applicable to variations of the first embodiment which will follow.

First Variation of First Embodiment

Figure 6:
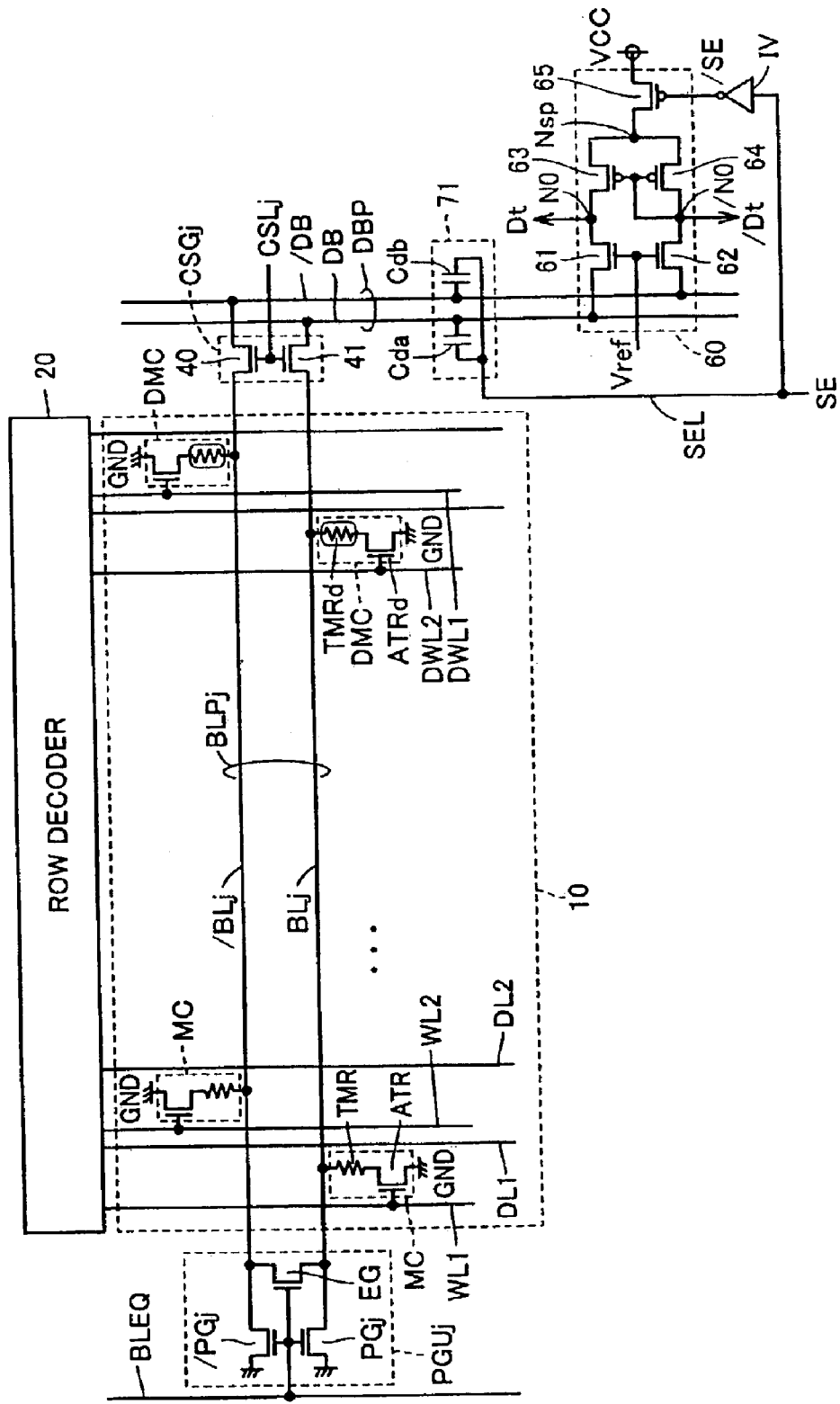
FIG. 6 shows a configuration of a data reading circuit system according to a first variation of the fist embodiment of the present invention.

Referring to FIG. 6, a data reading circuit system according to a first variation of the first embodiment of the present invention is different from that of the first embodiment in that capacitors Cda and Cdb in level adjusting circuit 71 are electrically connected with a signal line SEL transmitting control signal SE, and an inverted signal /SE of control signal SE is input to transistor 65 of differential amplifier 60 via inverter IV. As a result, a signal line ϕis no longer required and thus is omitted.

Figure 7:
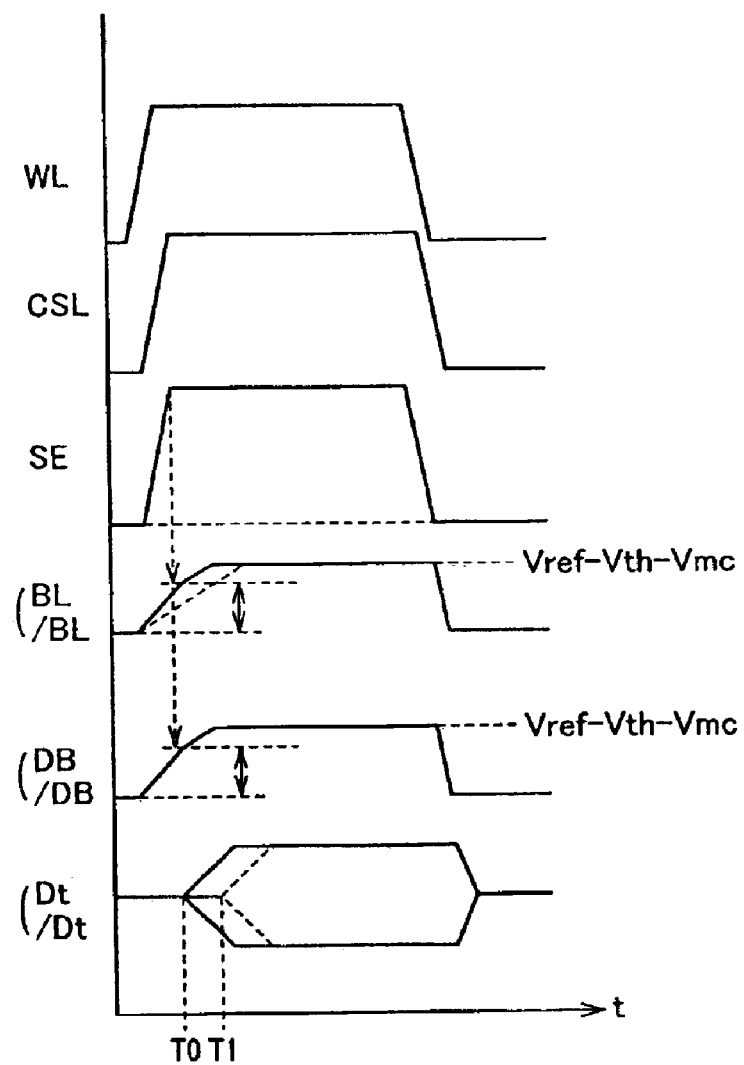
FIG. 7 is a timing chart indicating a data reading operation of MRAM device according to the first variation of the first embodiment of the present invention.

With the timing chart of FIG. 7, a data reading operation of MRAM device according to the first variation of the first embodiment of the present embodiment will be described.

As for the state before a data reading operation, it is the same as the data reading circuit system of the first embodiment described above, and thus the description thereof will not be repeated.

The data reading circuit system according to the first variation of the first embodiment of the present invention is different from that of the first embodiment in that bit lines and data lines are boosted by the capacitive coupling of capacitors Cda and Cdb at the same timing of the activation timing of the differential amplifier. The rest of the configuration is the same as in the first embodiment, and thus the description thereof will not be repeated.

By employing such a configuration, similarly to the data reading operation according to the first embodiment above, a data reading operation can be achieved at high speed and accurately. Further, the number of parts can be reduced, since the signal line transmitting control signal /SE activating differential amplifier 60 is generically used in place of signal line ϕku to boost the voltage level of bit lines and data lines by the capacitive coupling of capacitors Cda and Cdb.

Second Variation of First Embodiment

In the first embodiment of the present invention, the configuration has been described in which the voltage level of corresponding bit lines and data lines is boosted by the capacitive coupling of capacitors Cda and Cdb based on signal line ϕku. On the other hand, depending on the voltage level of signal line ϕku provided, the voltage level of bit lines and data lines may excessively boosted, and thus it may undesirably damage a thin film magnetic material in a memory cell.

Now, a second variation of the first embodiment is described, in which a data reading operation is attainted while avoiding the damage of the magnetic material by setting the voltage level of bit lines BL and /BL to the prescribed voltage level value at most.

Figure 8:
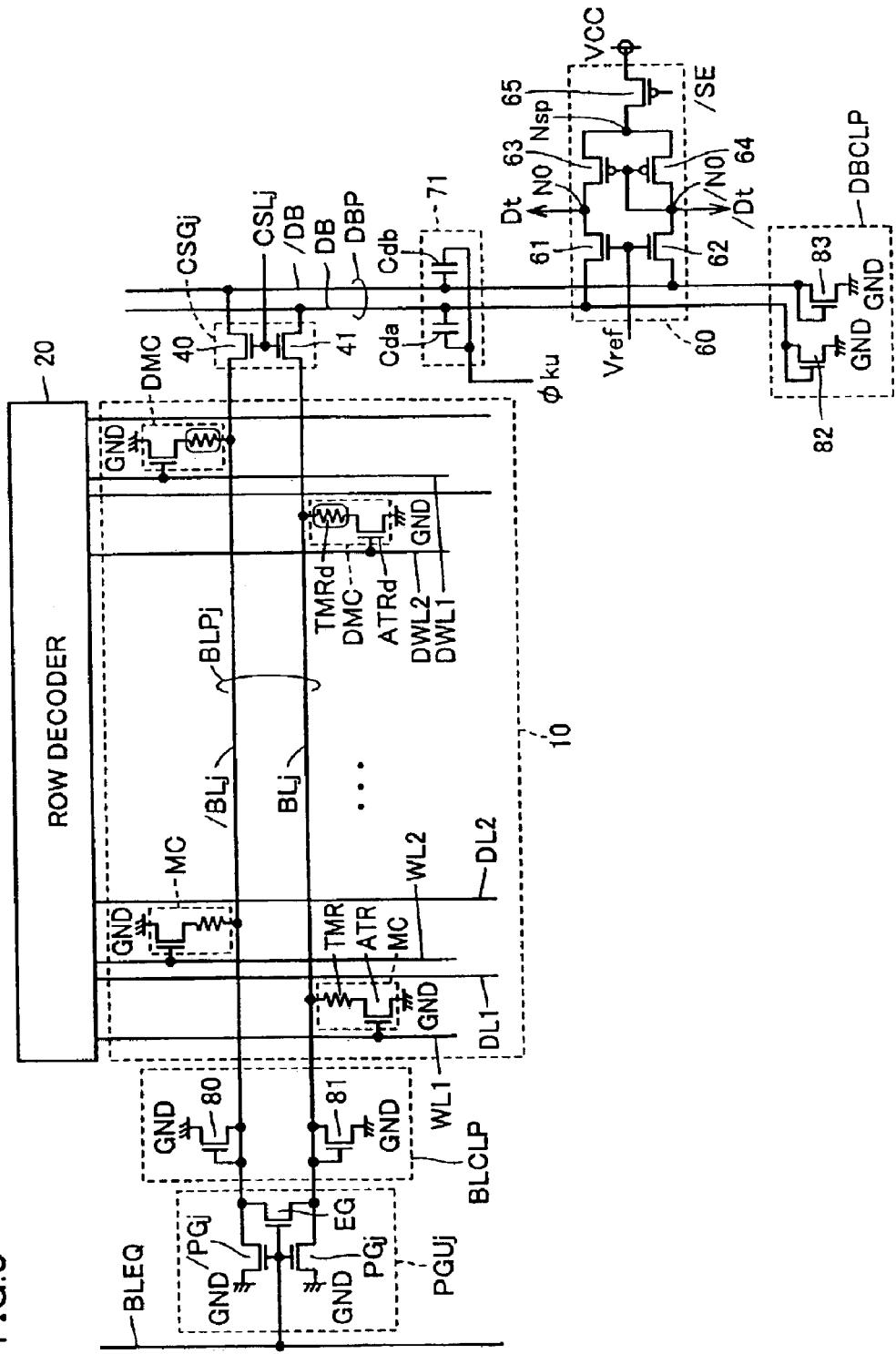
FIG. 8 shows a configuration of a data reading circuit system according to a second variation of the fist embodiment of the present invention.

Referring to FIG. 8, a data reading circuit system according to the second variation of the first embodiment of the present invention is different from the data reading circuit system of FIG. 2 in that a bit line clamp circuit BLCLP and a data line clamp circuit DBCLP are further provided. The rest of the configuration is similar to the data reading circuit system of the first variation of the first embodiment, thus the description thereof will not be repeated.

Bit line clamp circuit BLCLP includes so-called diode-connected transistors 80 and 81.

Specifically, transistor 80 is connected between ground voltage GND and bit line /BL, with its gate connected to bit line /BL. Transistor 81 is connected between ground voltage GND and bit line BL, with its gate connected to bit line BL.

Data line clamp circuit DBCLP includes so-called diode-connected transistors 82 and 83. Specifically, transistor 82 is connected between ground voltage GND and data line DB, with its gate connected to data line. DB. Transistor 83 is connected between ground voltage GND and data line /DB, with its gate is connected to data line /DB.

Bit line clamp circuit BLCLP lowers the voltage of bit lines BL and /BL to the prescribed voltage level at most. Data line clamp circuit DBCLP lowers the voltage of data lines DB and /DB to the prescribed voltage level at most.

The prescribed voltage is set to have "Vref-Vth-Vmc" as an on-voltage of so-called diodes above.

By employing such a configuration, the voltage boost of bit lines and data lines is suppressed to a prescribed voltage level at most to avoid the damage of a thin film magnetic material in a memory cell. Thus, a data reading operation can be performed more stably than the data reading operation according to the first variation of the first embodiment.

It should be noted that the second variation of the first embodiment is applicable to the first embodiment and other variations thereof as well.

Figure 9:
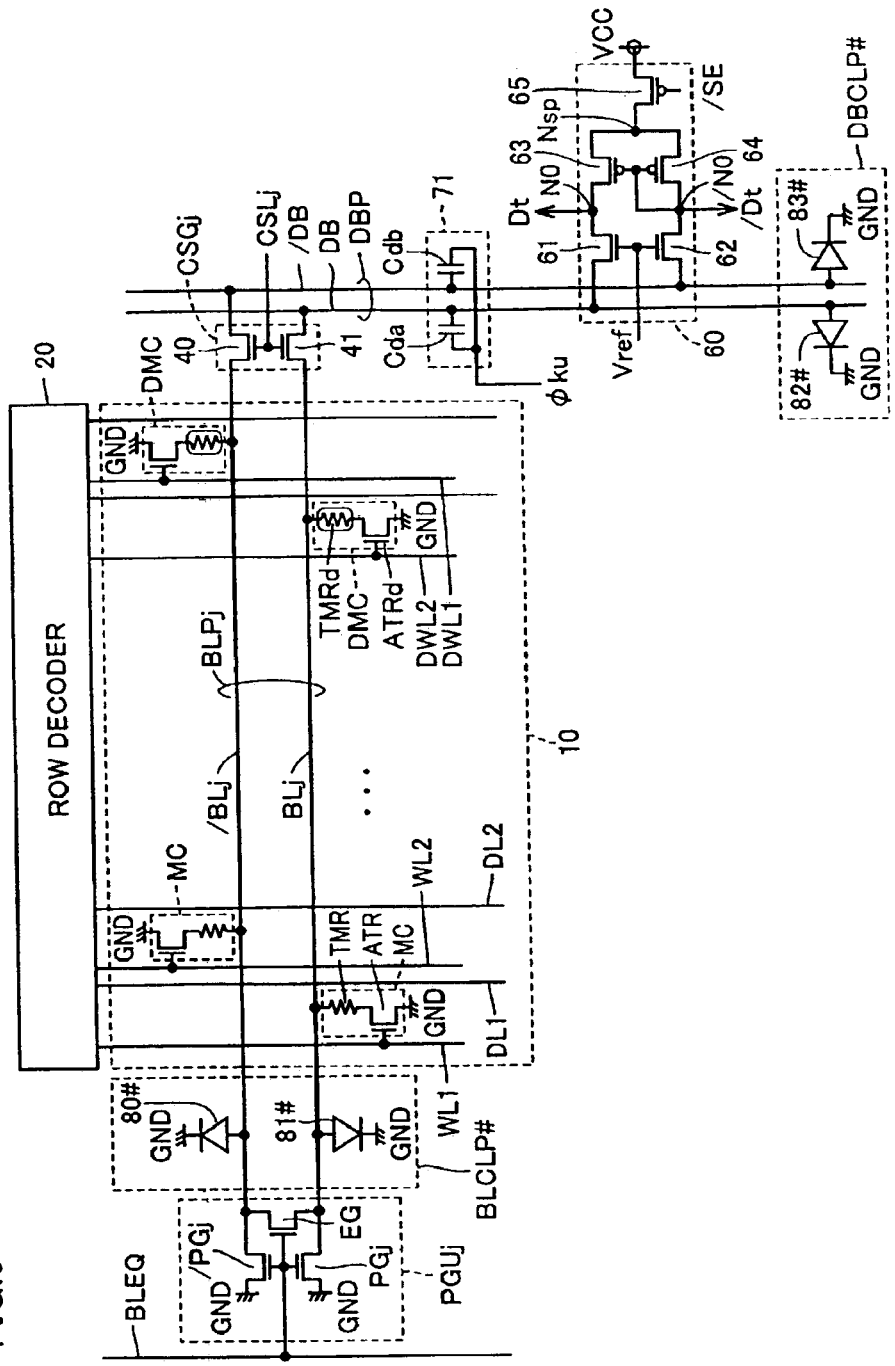
FIG. 9 shows another configuration of a data reading circuit system according to the second variation of the fist embodiment of the present invention.

Referring to FIG. 9, a data reading circuit system according to another configuration of the second variation of the first embodiment is different from the configuration of the data reading circuit system of FIG. 8 in that bit line clamp circuit BLCLP is replaced by a bit line clamp circuit BLCLP# and data line clamp circuit DBCLP is replaced by a data line clamp circuit DBCLP#.

Bit line clamp circuit BLCLP# is different from bit line clamp circuit BLCLP in that normal diodes 80#, 81# are provided in place of diode-connected transistors 80, 81. Diodes 80#, 81# have their anodes electrically coupled to ground voltage GND, and have their cathodes electrically coupled to bit lines BLj, /BLj.

Data line clamp circuit DBCLP# is different from data line clamp circuit DBCLP in that normal diodes 82#, 83# are provided in place of diode-connected transistors 82, 83. Diodes 82#, 83# have their anodes electrically coupled to ground voltage GND, and have their cathodes electrically coupled to data lines DB, /DB.

Specifically, the configuration is different in that normal transistors are employed in place of diode-connected transistors, and operations thereof and the like are the same.

Third Variation of First Embodiment

As the configuration of data reading circuit system according to the first embodiment of the present invention, the configuration has been described in which capacitors Cda and Cdb are charged based on signal line φku, and voltage level of corresponding bit lines and data lines is boosted by the capacitive coupling. On the other hand, after completing charging data lines and the like, the capacitors may possibly become load capacitances of bit lines and data lines, delaying a data reading operation.

Now, a third variation of the first embodiment of the present invention is described, which is a configuration achieving a data reading operation faster than the first embodiment and its variations above.

Figure 10:
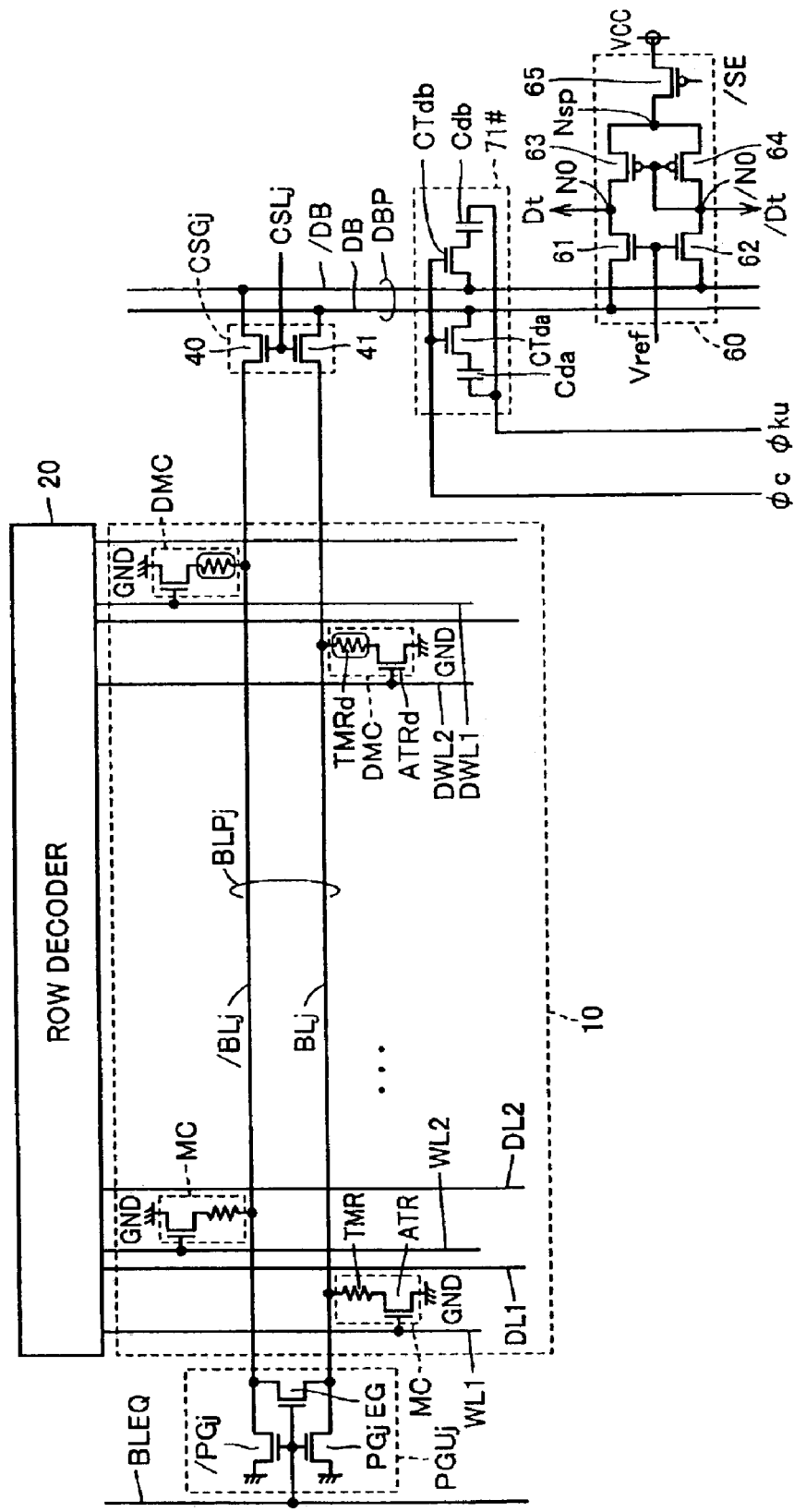
FIG. 10 shows the configuration of a data reading circuit system according to a third variation of the fist embodiment of the present invention.

Referring to FIG. 10, a data reading circuit system according to a third variation of the first embodiment of the present invention is different from the data reading circuit system in FIG. 2 in that level adjusting circuit 71 is replaced by a level adjusting circuit 71#. The rest of the configuration is similar to the data reading circuit system according to the first embodiment, thus the description thereof will not be repeated.

Level adjusting circuit 71# is different from level adjusting circuit 71 in that it further includes transistors CTda, CTdb.

Capacitor Cda and transistor CTda are serially connected between signal line φku and data line DB. The gate of transistor CTda receives control signal φc. Capacitor Cdb and transistor CTdb are serially connected between signal line φku and data line /DB. The gate of transistor CTdb receives control signal φc.

Figure 11:
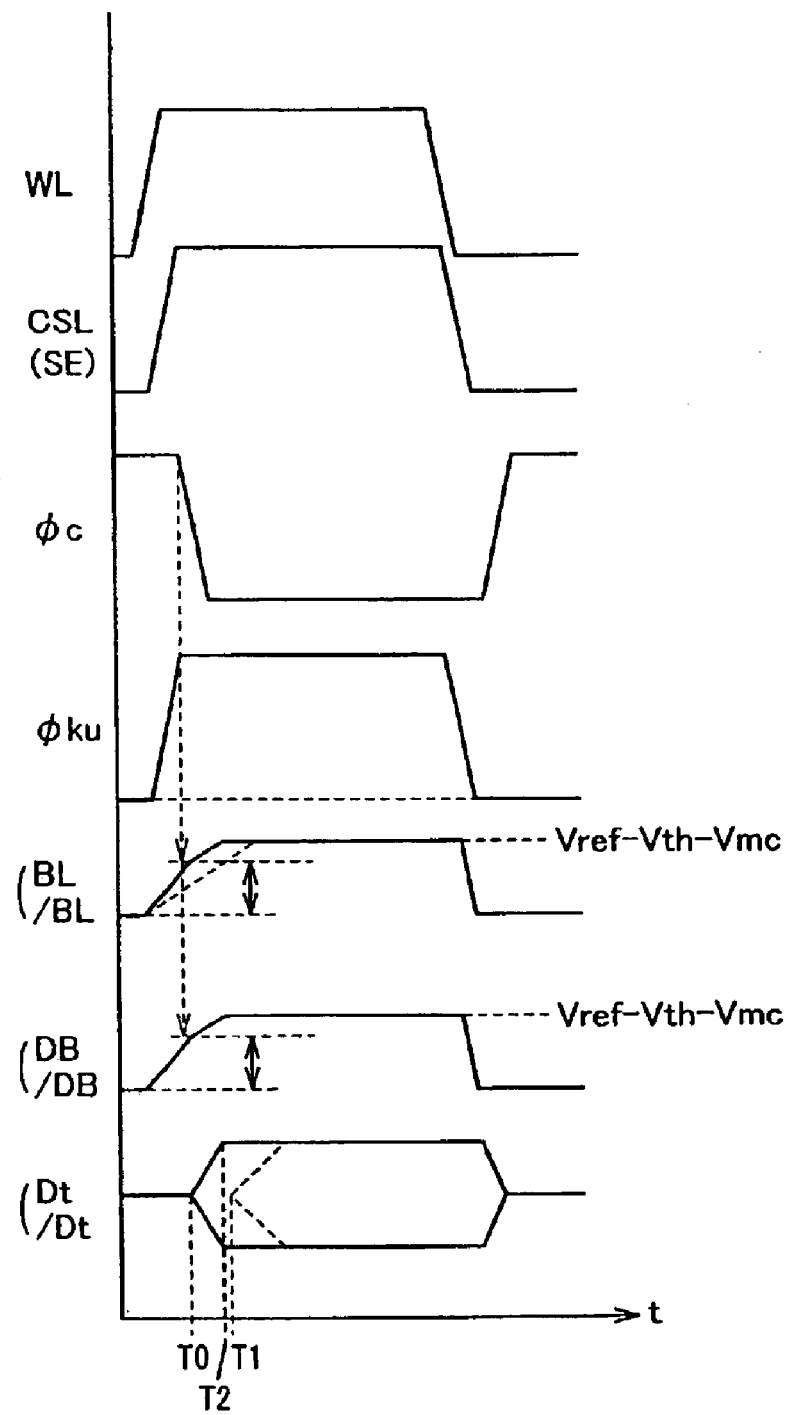
FIG. 11 is a timing chart indicating a data reading operation of an MRAM device according to the third variation of the first embodiment of the present invention.

With the timing chart of FIG. 11, a data reading operation of MRAM device according to the third variation of the first embodiment of the present invention is described.

Before a data reading operation, control signal φc is set at "H" level. Accordingly, the voltage level of data lines DB and /DB is boosted by the capacitive coupling of capacitors Cda and Cdb, as described referring to FIG. 7. Next, at time point T0 where charging of data lines DB and /DB to a prescribed level by the capacitive coupling is finished, control signal φc is set at "L" level. Accordingly, transistors CTda and CTdb disconnect the electric connection between capacitors Cda, Cdb, and data lines DB, /DB, respectively. Therefore, in a data reading operation to follow, capacitors Cda and Cdb will not become load capacitance. In the present variation, read data is generated at time point T2, which follows time point T0 where a voltage level difference between read data Dt, /Dt starts to occur. Thus, a data reading operation faster than the first embodiment and its variations above can be achieved.

Fourth Variation of First Embodiment

As the configuration of data reading circuit system according to the first embodiment of the present invention, the configuration has been described in which voltage level of bit lines and data lines is boosted to a prescribed level by the capacitive coupling of capacitors Cda and Cdb. A data reading circuit system according to a fourth variation of the first embodiment has a configuration in which bit lines and data lines are charged using a capacitive element structured with metal insulator semiconductor gate field effect transistor (hereinafter also refereed to as an MIS capacitor).

Figure 12:
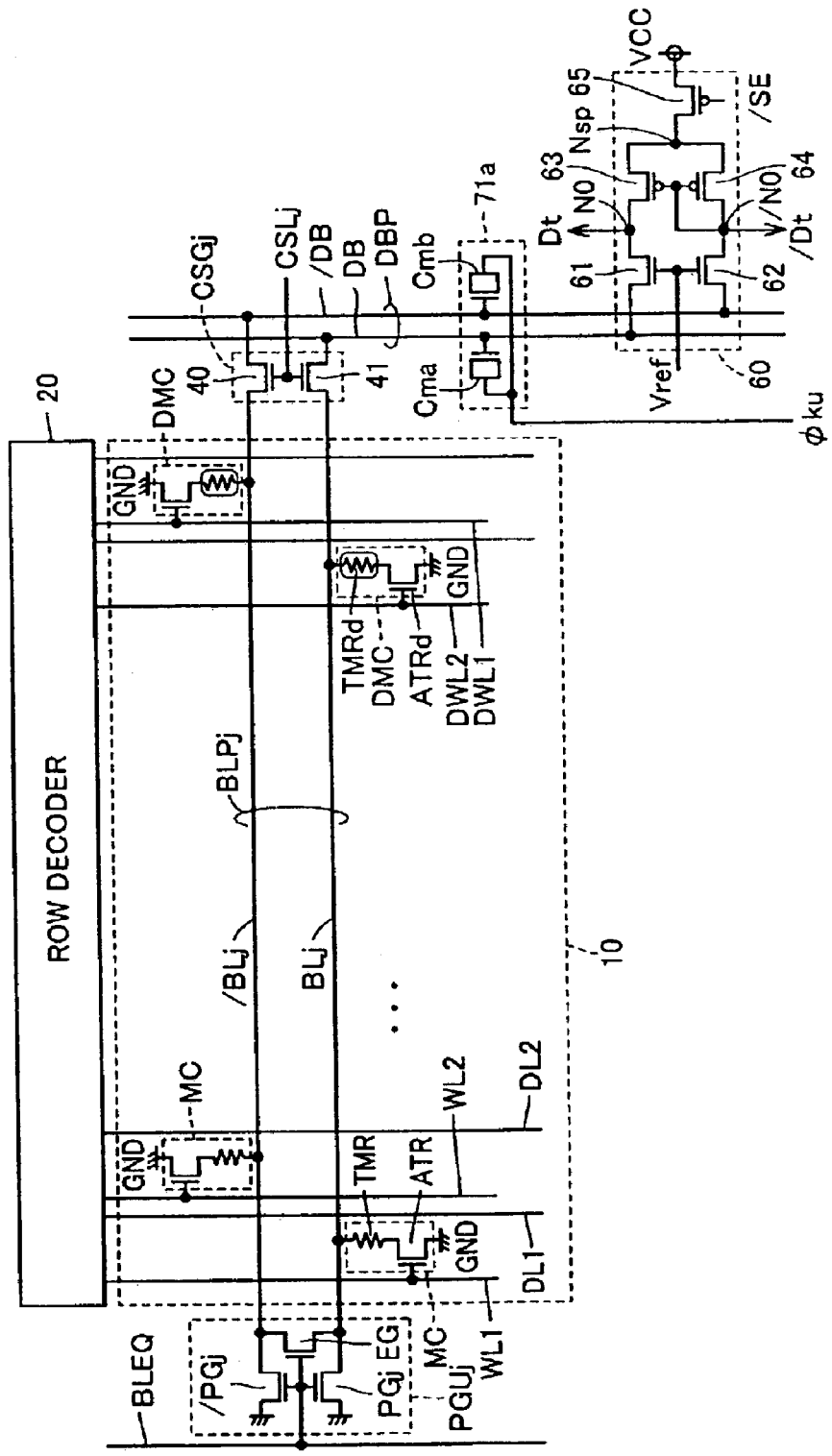
FIG. 12 shows a configuration of a data reading circuit system according to a fourth variation of the fist embodiment of the present invention.

Referring to FIG. 12, a data reading circuit system according to a fourth variation of the first embodiment of the present invention is different from the data reading circuit system in FIG. 2 in that level adjusting circuit 71 is replaced by a level adjusting circuit 71a. The rest of the configuration is similar to the first variation of the first embodiment, thus the description thereof will not be repeated.

Level adjusting circuit 71a is different from level adjusting circuit 71 in that capacitors Cda, Cdb are replaced by MIS capacitors Cma, Cmb. MIS capacitor Cma has its gate electrically coupled to data line DB, and source and drain thereof is electrically coupled to signal line φku. MIS capacitor Cmb has its gate electrically coupled to data line /DB, and source and drain thereof is electrically coupled to signal line φku. In the present variation, MIS capacitors Cma, Cmb are N-channel MIS capacitors.

Now, the description of characteristics of MIS capacitor is given. A channel is formed when the gate voltage exceeds the threshold voltage, and MIS capacitor drives as a capacitive element. On the other hand, when the gate voltage is lower than a combined voltage level of source and drain voltages and the threshold voltage, the channel is not formed and MIS capacitor does not drive as a capacitive element.

In this configuration, directly after the initiation of a data reading operation, a channel is formed in each of MIS capacitors Cma, Cmb as the voltage level of data lines DB, /DB increases. Accordingly, MIS capacitors Cma, Cmb charges data lines DB, /DB as capacitive elements by the capacitive coupling, in accordance with the voltage level of signal line φku.

Thereafter, signal line φku is set to power supply voltage VCC level. Accordingly, the voltage level of signal line φku will be higher than the gates of MIS capacitors Cma, Cmb, and thus MIS capacitors Cma, Cmb do not drive as capacitive elements. In other words, MIS capacitors Cma, Cmb are in off state.

Therefore, in the charging period, since the MIS capacitors are in on state until charging the data lines to a prescribed level and thereafter turn to off state, it will not be unnecessary load capacitances after charging the data lines. Hence, a fast data reading operation can be achieved similarly to the third variation.

Further, since there is no need to adjust the voltage level by signal line φku, the number of parts can be reduced.

Fifth Variation of First Embodiment

Now, the description of a fifth variation of the first embodiment of the present invention is given, which has another configuration of boosting the voltage level of corresponding bit lines and data lines by the capacitive coupling of MIS capacitors Cma and Cmb.

Figure 13:
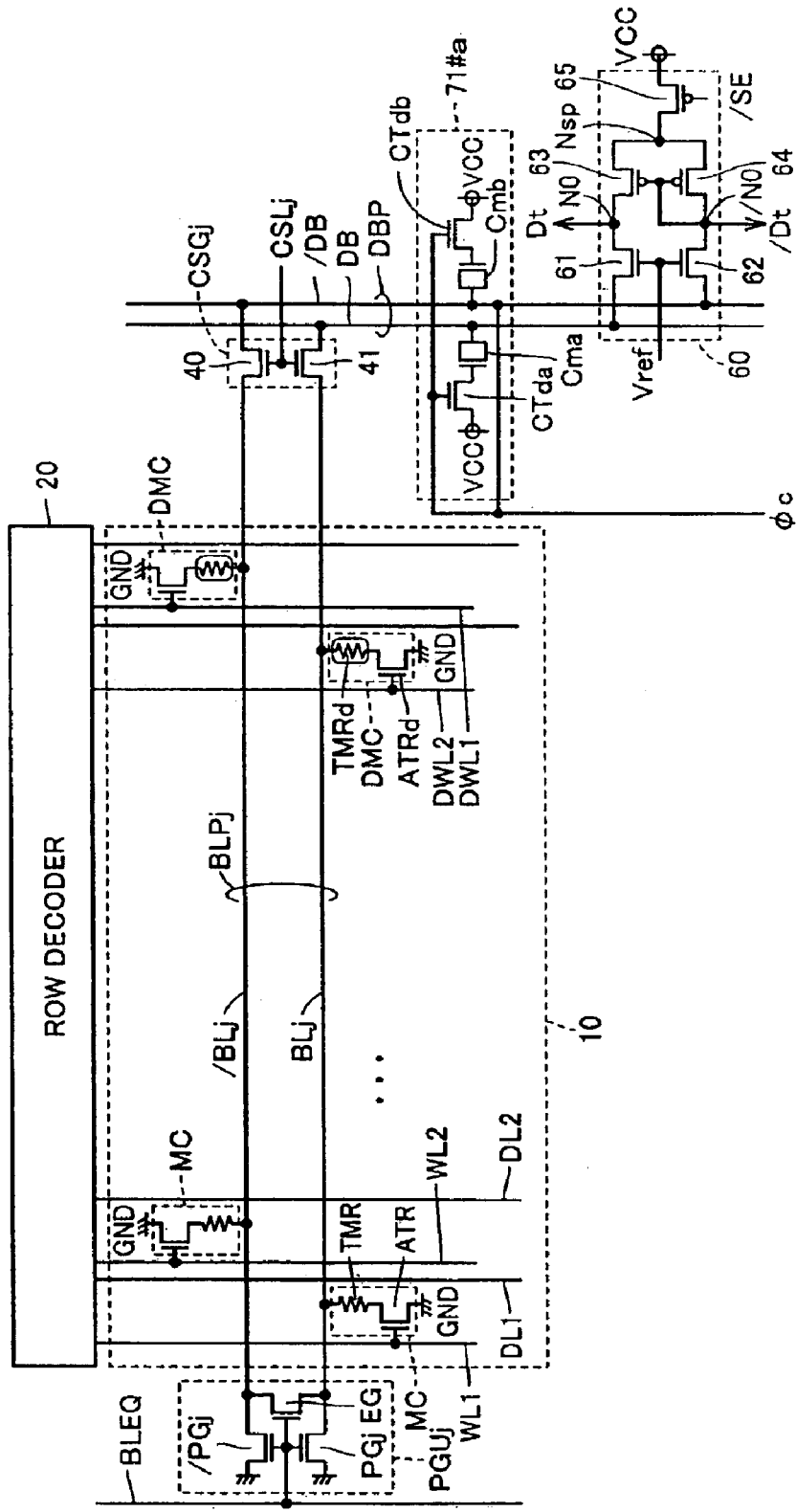
FIG. 13 shows a configuration of a data reading circuit system according to a fifth variation of the fist embodiment of the present invention.

Referring to FIG. 13, a data reading circuit system according to the fifth variation of the first embodiment of the present invention is different from the data reading circuit system according to the fourth variation of the first embodiment in that level adjusting circuit 71a is replaced by a level adjusting circuit 71a#.

Level adjusting circuit 71a# is different from level adjusting circuit 71a in that it is further provided with transistors CTda, CTdb. Specifically, level adjusting circuit 71a# includes transistors CTda, CTdb, and MIS capacitors Cma, Cmb. MIS capacitor Cma and transistor CTda are serially connected between power supply voltage VCC and data line DB. Transistor CTda is arranged between capacitor Cma and power supply voltage VCC, and its gate receives control signal φc. MIS capacitor Cma has its gate electrically coupled to transistor CTda. MIS capacitor Cmb and transistor CTdb are serially connected between power supply voltage VCC and data line /DB. Transistor CTdb is arranged between MIS capacitor Cmb and power supply voltage VCC, and its gate receives control signal φc. MIS capacitor Cmb has its gate electrically coupled to transistor CTdb.

Figure 14:
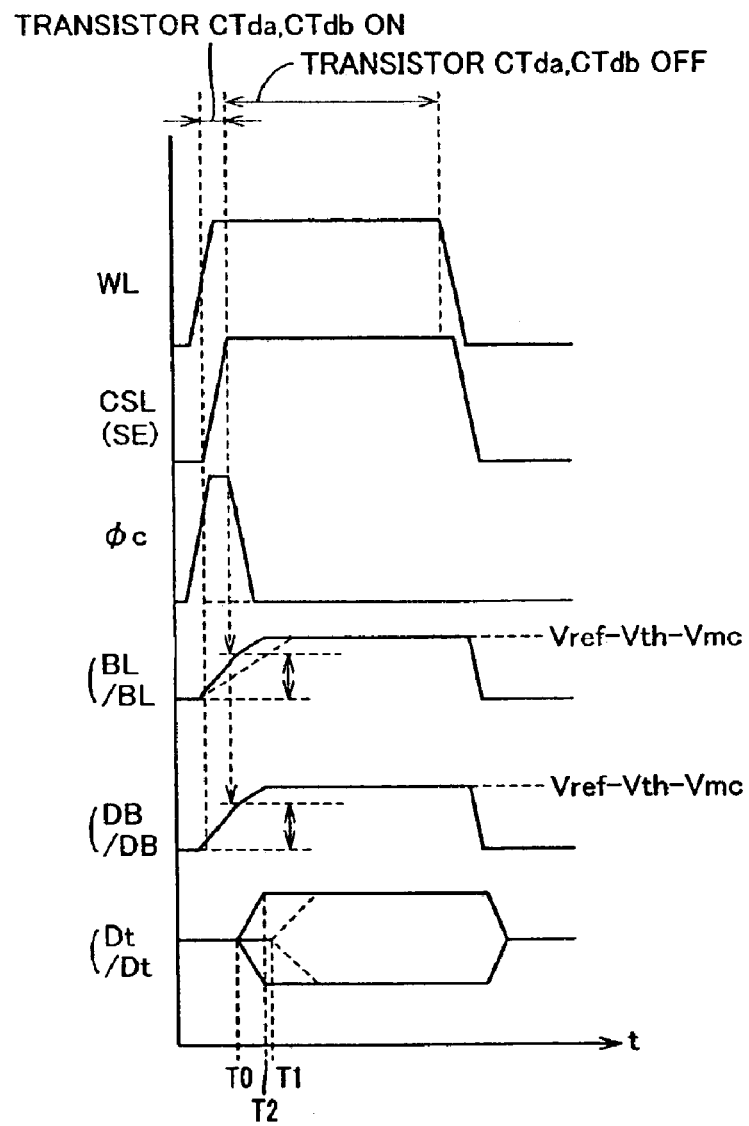
FIG. 14 is a timing chart indicating a data reading operation of MRAM device according to the fifth variation of the first embodiment of the present invention.

With the timing chart of FIG. 14, a data reading operation of an MRAM device according to the fifth variation of the first embodiment of the present invention will be described.

In data reading, in accordance with control signal φc being "H" level, the voltage level of bit lines BLj, /BLj and data lines DB, /DB increases by the capacitive coupling of MIS capacitors. Next, at time point T0 where charging of the lines by capacitive coupling to a prescribed level is completed, control signal φc is set to "L" level. Accordingly, electrical connections between MIS capacitors Cma, Cmb and bit lines BLj, /BLj are disconnected. Thus, in a data reading operation to follow, MIS capacitors Cma, Cmb will not become load capacitances, and a read data is generated at time point T2 which is directly after time point T0 where a voltage difference between read data Dt, /Dt begins to occur, as shown in FIG. 14. Thus, a fast data reading operation can be achieved.

Sixth Variation of First Embodiment

Figure 15:
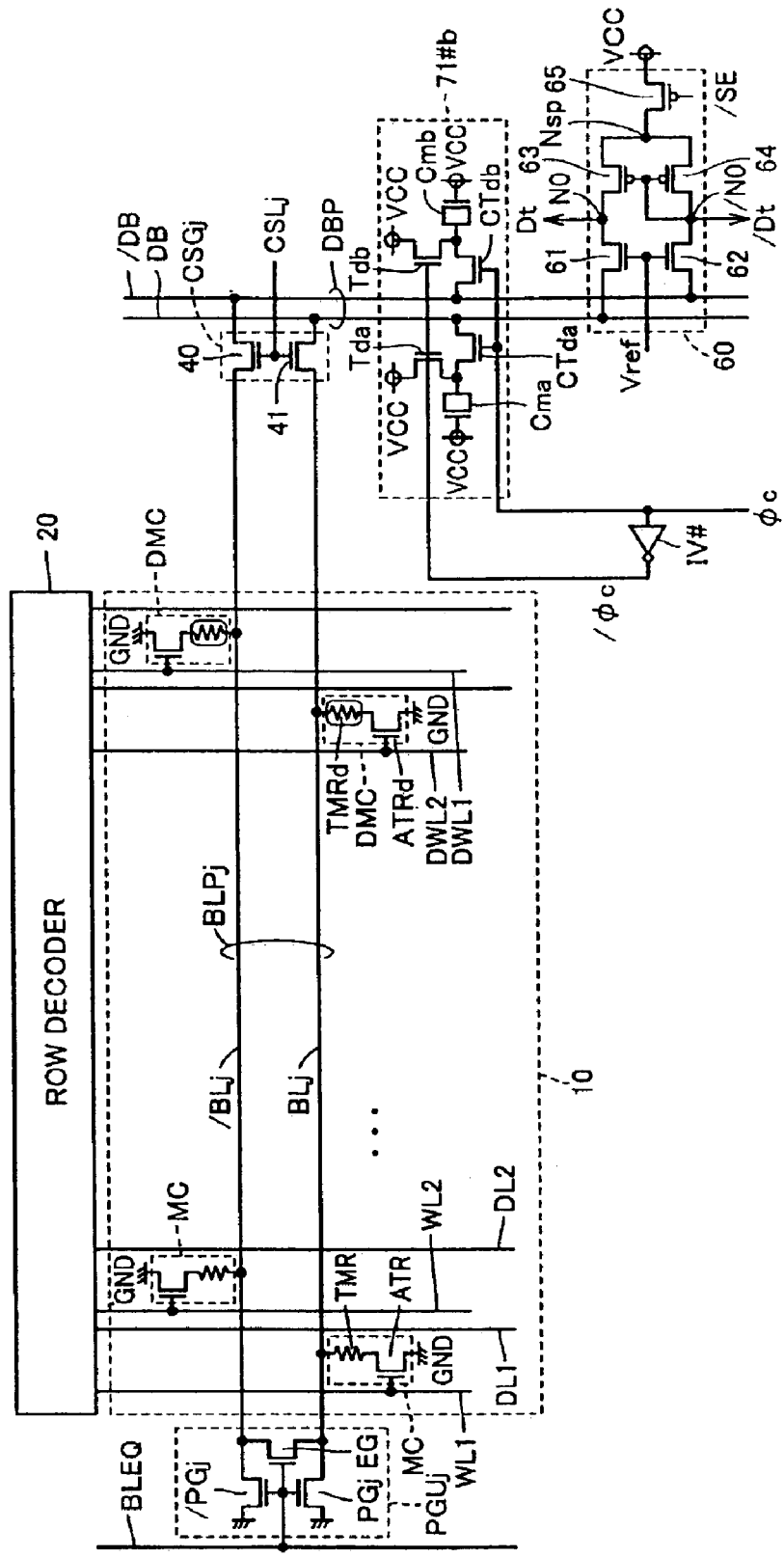
FIG. 15 shows a configuration of a data reading circuit system according to a sixth variation of the fist embodiment of the present invention.

Now, the description of a data reading circuit system according to a sixth variation of the first embodiment of the present invention is given, which has another configuration of electrically disconnecting capacitors Cma and Cmb after charging bit lines and data lines.
114 Referring to FIG. 15, the data reading circuit system according to the sixth variation of the first embodiment of the present invention is different from the data reading circuit system according to the fifth variation of the first embodiment in that level adjusting circuit 71#a is replaced by a level adjusting circuit 71b#, and an inverted signal /φc of control signal φc via inverter IV# is input to level adjusting circuit 71#b. The rest of the configuration is similar, thus the description thereof will not be repeated.

Level adjusting circuit 71#b includes transistors Tda, Tdb, CTda, CTdb, and MIS capacitors Cma, Cmb. MIS capacitor Cma and transistor CTda are serially connected between power supply voltage VCC and data line DB. MIS capacitor Cma has its gate connected to power supply voltage VCC, and the gate of transistor CTda receives control signal φc. MIS capacitor Cmb and transistor CTdb are serially connected between power supply voltage VCC and data line /DB. The gate of MIS capacitor Cmb is connected to power supply voltage VCC, and the gate of transistor CTdb receives control signal φc. Transistor Tda is arranged between power supply voltage VCC and a connection node of MIS capacitor Cma and transistor CTda, and its gate receives inverted signal /φc of control signal φc via inverter IV#. Transistor Tdb is arranged between power supply voltage VCC and a connection node of MIS capacitor Cmb and transistor CTdb, and its gate receives inverted signal /φc of control signal φc via inverter IV#.

The data reading operation of MRAM device according to the sixth variation of the first embodiment of the present invention is similar to the fifth variation, thus the description thereof will not be repeated.

Specifically, as control signal φc becomes "H" level, the voltage level of bit lines BLj, /BLj, data lines DB, /DB increases by the capacitive coupling of MIS capacitors. Accordingly, control signal φc is set to "L" level at time point T0 where the charging is completed. The electrical connections between MIS capacitors Cma, Cmb and data lines DB, /DB are disconnected. Therefore, MIS capacitors Cma, Cmb will not become load capacitances and thus a fast data reading operation can be achieved.

As control signal φc turns to "L" level, transistors Tda and Tdb turn on, and a source and drain of MIS capacitors Cma, Cmb are electrically coupled to power supply voltage VCC. Accordingly, since the source and drain of at MIS capacitors Cma and Cmb are electrically coupled to power supply voltage VCC, charges are not stored, thus decreasing electric consumption.

Second Embodiment

In the first embodiment, description has been made for a non-volatile memory device using a non-volatile memory element, i.e., a tunneling magneto-resistance element. As for a second embodiment, an application of the configuration of the present invention using other non-volatile memory element will be described.

Figure 16A:
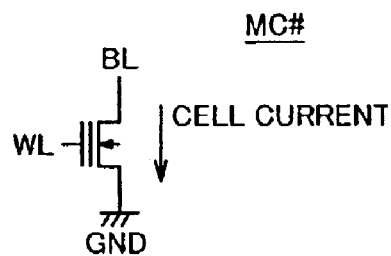
FIGS. 16A, 16B, and 16C are conceptual illustrations of a memory cell that can be replaced with a memory cell according to the first embodiment of the present invention.

FIG. 16A is a conceptual view where a non-volatile memory element of a flash memory is employed as a memory cell MC#.

As shown in FIG. 16A, memory cell MC# is arranged between bit line BL and ground voltage GND, with its gate electrically coupled to word line WL.

In data writing, word line WL and bit line BL are boosted to inject hot electrons into a floating gate of the flash memory. Thus, threshold voltage Vth of the flash memory rises. Corresponding to the high/low threshold voltage Vth, a binary stored data is stored. In data reading, a pass current in memory cell MC# corresponding to threshold voltage Vth is detected. Based on the current amount, a data reading operation can be attained.

Figure 16B:
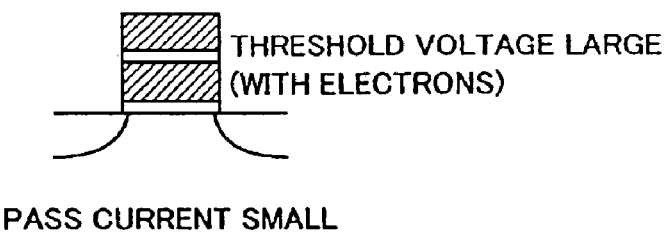
Figure 16C:
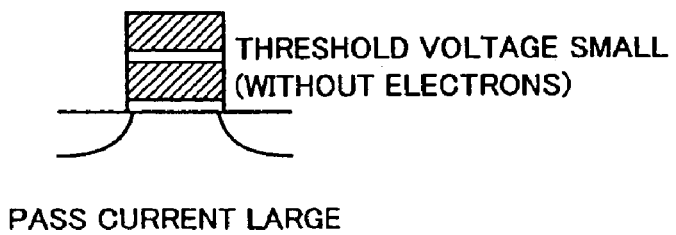

FIGS. 16B and 16C are conceptual views of memory cell MC# where data writing is performed.

As shown in FIG. 16B, threshold voltage Vth rises by the electron injection, and the pass current is reduced correspondingly.

As shown in FIG. 16C, since threshold voltage Vth is set lower when the electrons are not injected, the pass current is increased correspondingly.

Then, a pass current difference between a pass current flowing through this memory cell MC# and a reference current generated based on a dummy memory cell and the like is converted into an amplified voltage difference by differential amplifier 60. Thus, a data reading operation similar to the first embodiment can be achieved.

MTJ memory cell and the flash memory are similar in that a data reading operation is performed in accordance with the electric resistance (or the pass current) of a selected memory cell, it is applicable to the memory cell array described in the first embodiment. In this case, similar configuration Variation of Second Embodiment.

In the second embodiment above, the application of the present invention to a flash memory has been described. In a variation of the second embodiment of the present invention, an application of the present invention to a variable resistance memory with a phase transition will be described.

Figure 17A:
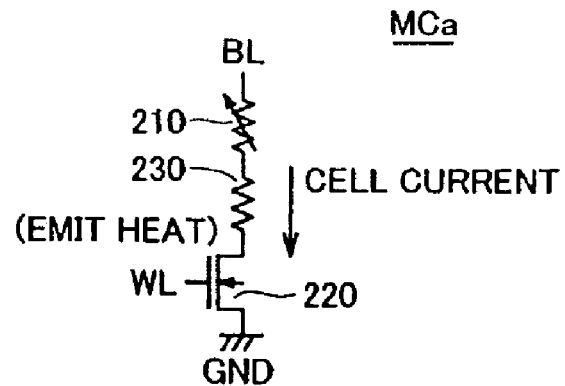
FIGS. 17A, 17B, and 17C are conceptual illustrations of another memory cell that can be replaced with a memory cell according to the first embodiment of the present invention.

FIG. 17A is a conceptual view where a non-volatile memory element of a variable resistance element is used as memory cell MCa.

As shown in FIG. 17A, memory cell MCa includes a chalcogenide layer 210 of a phase-changing element and a switching transistor 220 serially connected between bit line BL and ground voltage GND. Between chalcogenide layer 210 and switching transistor 220, a heating element that emits heat by a pass current is provided. The gate of switching transistor 220 is connected to word line WL.

In data writing, switching transistor 220 turns on, and from bit line BL a data write current flows through chalcogenide layer 210 and heating element 230. In accordance with the supply pattern of the data write current (e.g., the supply period and the amount of supply current), chalcogenide layer 210 changes its phase to either one of a crystalline state or an amorphous state. The electric resistance of chalcogenide layer 210 changes depending on the states. Specifically, the chalcogenide layer in the amorphous state has higher electric resistance than in the crystalline state.

Therefore, when reading data, switching transistor 220 turns on to have data read current, which does not affect the phase changing, flowing through chalcogenide layer 210. Thus, the data reading operation similar to MTJ cell can be achieved based on the difference in electric resistance.

Figure 17B:
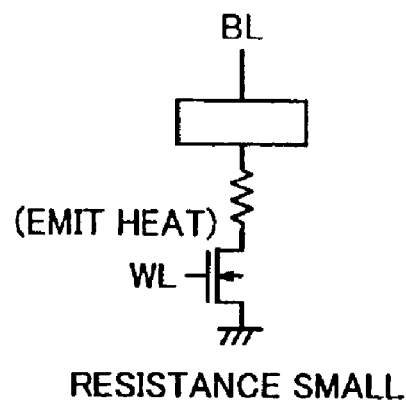

FIG. 17B shows the electric resistance value of chalcogenide layer 210 in the crystalline state. In this case, since electric resistance value is small, the pass current will be large.

Figure 17C:
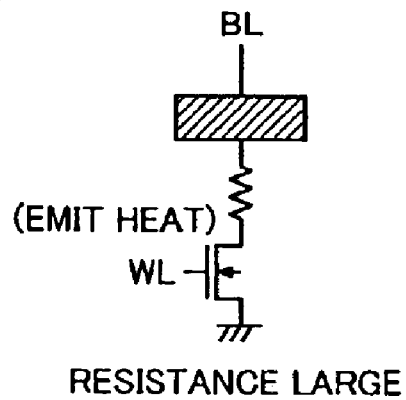

FIG. 17C shows the electric resistance value of chalcogenide layer 210 in the amorphous state. In this case, since electric resistance value is large, the pass current will be small.

Therefore, by converting a pass current difference between the pass current flowing through memory cell MCa and a reference current generated based on a dummy memory cell and the like into an amplified voltage difference by sense amplifier SA0, a data reading operation similar to the first embodiment can be achieved.

Since an MTJ memory cell and a variable resistance memory element based on a phase transition are similar in that the data reading operation is performed according to the electric resistance (or the pass current) of a selected memory cell, it is applicable to the memory cell array of the first embodiment. In this case, the data reading configuration shown in FIG. 2 can be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory device, comprising:
   a plurality of memory cells, through each of said plurality of memory cells a pass current corresponding to a stored data flowing in a data reading operation;
   a plurality of bit lines, at least one of said plurality of bit lines being connected to a first voltage via a selected memory cell corresponding to a selected address among said plurality of memory cells in said data reading operation;
   a data line commonly provided to said plurality of bit lines for electrically coupling to said at least one of said plurality of bit lines in said data reading operation;
   a reference current supplying unit generating a reference current used for a comparison with said selected memory cell;
   a differential amplifier connected to a second voltage in said data reading operation for supplying a pass current to said data line, and for reading the stored data of said selected memory cell corresponding to a current difference between said pass current and said reference current generated by said reference current supplying unit; and
   a level adjusting circuit provided corresponding to said data line for changing a voltage level of said data line by capacitive coupling in said data reading operation.

2. The non-volatile memory device according to claim 1, further comprising
   a signal line transmitting a change in said voltage level to said level adjusting circuit; wherein
   said level adjusting circuit includes a capacitor provided between said data line and said signal line.

3. The non-volatile memory device according to claim 2, wherein
   said level adjusting circuit further includes a disconnecting portion disconnecting said capacitor and said data line after a prescribed period elapses in said data reading operation.

4. The non-volatile memory device according to claim 1, wherein
   said differential amplifier sets a voltage level of said data line between said first voltage and said second voltage in said data reading operation.

5. The non-volatile memory device according to claim 1, further comprising
   a signal line activating said differential amplifier, wherein
   said level adjusting circuit includes a capacitor provided between said data line and said signal line.

6. The non-volatile memory device according to claim 1, further comprising
   a clamp circuit provided corresponding to at least one of said bit line and said data line for maintaining a voltage level of said at least one of said bit line and said data line to a prescribed voltage level in said data reading.

7. A non-volatile memory device, comprising:
   a plurality of memory cells, through each of said plurality of memory cells a pass current corresponding to a stored data flowing in a data reading operation;
   a plurality of bit lines, at least one of said plurality of bit lines being connected to a first voltage via a selected memory cell corresponding to a selected address among said plurality of memory cells in said data reading operation;
   a data line commonly provided to said plurality of bit lines for electrically coupling to said at least one of said plurality of bit lines in said data reading operation;
   a reference current supplying unit generating a reference current used for a comparison with said selected memory cell;
   a differential amplifier connected to a second voltage in said data reading operation for supplying a pass current to said data line, and for reading said stored data of said selected memory cell corresponding to a current difference between said pass current and said reference current generated by said reference current supplying unit;
   a capacitive element provided corresponding to said data line, and formed with a metal insulator semiconductor field effect transistor having its gate electrically coupled to said data line; and
   a signal line electrically coupled to source and drain of said capacitive element; wherein
   said capacitive element raises a level of said data line for a prescribed period.

* * * * *